(12) United States Patent
Suarez et al.

(10) Patent No.: US 10,649,949 B1
(45) Date of Patent: May 12, 2020

(54) RADIATION HARDENED INPUT/OUTPUT EXPANDER WITH I²C AND SPI SERIAL INTERFACES

(71) Applicant: United States of America as represented by the Administrator of NASA, Washington, DC (US)

(72) Inventors: George Suarez, Columbia, MD (US); Jeffrey J. Dumonthier, Ashburn, VA (US)

(73) Assignee: United States of America as represented by the Administrator of NASA, Washington, DC (US)

(*) Notice: Subject to any disclaimer, the term of this patent is extended or adjusted under 35 U.S.C. 154(b) by 213 days.

(21) Appl. No.: 15/846,821

(22) Filed: Dec. 19, 2017

(51) Int. Cl.
| | |
|---|---|
| *H03K 19/003* | (2006.01) |
| *G06F 13/42* | (2006.01) |
| *G06F 13/16* | (2006.01) |
| *G06F 13/24* | (2006.01) |
| *G06F 13/40* | (2006.01) |

(52) U.S. Cl.
CPC ...... *G06F 13/4282* (2013.01); *G06F 13/1673* (2013.01); *G06F 13/24* (2013.01); *H03K 19/0033* (2013.01); *G06F 13/4068* (2013.01); *G06F 2213/0016* (2013.01); *G06F 2213/2414* (2013.01)

(58) Field of Classification Search
CPC ............... G06F 13/4282; G06F 13/362; G06F 13/4068; G06F 2213/0016; H03K 19/0033
See application file for complete search history.

(56) References Cited

U.S. PATENT DOCUMENTS

| | | | | |
|---|---|---|---|---|
| 6,724,761 | B1* | 4/2004 | Moy-Yee | H04B 7/18586 370/323 |
| 7,941,687 | B2 | 5/2011 | Rogers et al. | |
| 8,832,488 | B2 | 9/2014 | Rogers et al. | |
| 2006/0123292 | A1* | 6/2006 | Bansal | G01R 31/31723 714/724 |
| 2006/0129374 | A1* | 6/2006 | Larson | G06F 11/261 703/25 |
| 2016/0140077 | A1* | 5/2016 | Yoshida | G06F 13/4282 710/105 |

OTHER PUBLICATIONS

Microchip, "16-Bit I/O Expander with Serial Interface", Microchip Technology Inc., Dec. 8, 2006, pp. 1-44.
PCA9502 Product Data Sheet, "8-Bit I/O Expander with I2C-bus/SPI Interface", NXP Semiconductors N.V. 2016, pp. 1-27.

* cited by examiner

*Primary Examiner* — Ernest Unelus
(74) *Attorney, Agent, or Firm* — Christopher O. Edwards; Bryan A. Geurts

(57) ABSTRACT

The invention is a microcircuit configured as a compact, radiation hardened, low-power general purpose I/O expander. The expander may be controlled by an external microcontroller or central processing unit through a serial interface. The expander provides a simple solution to miniaturize static parallel I/O signals using a simplified serial interface such as I²C or SPI.

17 Claims, 12 Drawing Sheets

RADIATION HARDENED INPUT/OUTPUT EXPANDER WITH I²C AND SPI SERIAL INTERFACES

ORIGIN OF INVENTION

Invention by Government employees only. The invention described herein was made by employees of the United States Government, and may be manufactured and used by or for the Government for governmental purposes without the payment of any royalties thereon or therefor.

BACKGROUND OF THE INVENTION

Field of the Invention

The present invention relates electronic interfaces for converting commands from a serial interface to a parallel interface. More particularly, this invention relates to a radiation hardened 32-bit remote input/output (I/O) expander configured for converting commands from a serial interface into a parallel bus for use by miniaturized instrument electronics.

Description of Related Art

In the field of electronics, circuitry is used to define, control, and direct operations, processing, sensing and other functions. Data and control signals may be transported using data buses. Some buses are serial and require fewer dedicated signal pins or lines. Other buses may be parallel and require more signal pins or lines. There is often a need convert from serial to parallel and vice versa.

The Serial-Parallel Interface bus (SPI) is a synchronous serial communication interface specification used for short distance communication, primarily in embedded systems. The interface was developed by Motorola in the late 1980s before it spun off to Freescale then was then acquired by NXP Semiconductors and has become a de facto standard. Typical applications include secure digital cards and liquid crystal displays.

SPI devices communicate in full duplex mode using a master-slave architecture with a single master. The master device originates the frame for reading and writing. Multiple slave devices are supported through selection with individual slave select (SS) lines.

I²C (Inter-Integrated Circuit), pronounced "I-squared-C" or "I-two-C", is a multi-master, multi-slave, packet switched, single-ended, serial computer bus invented by Philips Semiconductor (now NXP Semiconductors). It is typically used for attaching lower-speed peripheral integrated circuits (ICs) to processors and microcontrollers in short-distance, intra-board communication. Alternatively, I²C is spelled I2C (pronounced I-two-C) or IIC (pronounced I-I-C).

When designing circuitry for a given application using microcontrollers, an engineer may also encounter the need for additional input/output (I/O) signals, which may require moving to a larger microcontroller, or adding additional logic, whether discrete, configurable programmable logic device (CPLD), field programmable gate array (FPGA), application specific integrated circuit (ASIC), etc. Moving to a larger microcontroller involves substantial reengineering of the product and added cost. It would be useful to have a way of expanding I/O signals without moving to a larger microcontroller or just to give the engineer added flexibility within a given microcontroller design constraints.

In some applications it is useful to be able to expand a serial interface to any given input/output (I/O) configuration, for example parallel ports, or just general I/O pins. Parallel interfaces come in many configurations and typically in increments of 8-bits for scalability. For example, the MCP23017, from Microchip Technology Inc., Chandler, Ariz., is a 16-bit I/O expander with a high-speed I²C or SPI serial interface is a general purpose parallel I/O expansion microcircuit. The PCA9502, from NXP Semiconductors, Eindhoven, Netherlands, is another 8-bit I/O expander, also with I²C or SPI serial interface.

Prior art solutions such as the MCP23017 and PCA9502 are not configured for harsh radiation environments such as space radiation. Additionally, such prior art solutions are typically limited to 8 or 16 general purpose I/O pins. Accordingly, there exists a need in the art for a small, low-power, radiation hardened microcircuit, with higher bit expansion capability, and I²C or SPI serial interfaces that could be used reliably in space applications.

SUMMARY OF THE INVENTION

One embodiment of the invention is an application specific integrated circuit (ASIC) which provides a compact, radiation hardened, low-power general purpose input/output function through a serial interface which is known as an expander. The ASIC provides a simple solution to miniaturize static parallel I/O signals using a simplified serial interface such as I²C or SPI. Embodiments of the ASIC have been designed in Hardware Description Language (HDL), simulated, verified and prototyped in a programmable device and later implemented using radiation hardened (rad-hard) standard cells in a 0.25 µm complementary metal oxide semiconductor (CMOS) process.

An input/output (I/O) expander is disclosed. The I/O expander may include a serial interface for communicating with an external controller. The I/O expander may further include a configuration and data registers block in communication with the serial interface. The I/O expander may further include a logic block in communication with the external controller and the configuration and data registers block. The I/O expander may further include a plurality of digital I/O ports in communication with the logic block and the configuration and data registers block, each of the plurality of digital I/O ports configured to send or receive static signals under control by the external controller through the serial interface.

BRIEF DESCRIPTION OF THE DRAWINGS

The following drawings illustrate exemplary embodiments for practicing the invention. Like reference numerals refer to like parts in different views or embodiments of the present invention in the drawings.

DETAILED DESCRIPTION

One embodiment of the invention is a radiation hardened 32-bit remote I/O expander, sometimes referred to herein as "RH-RIOX32", or simply "expander". The radiation hardened 32-bit remote I/O expander is a compact and low-power application specific integrated circuit (ASIC) that converts commands from a serial interface (SPI or I²C) into a parallel bus for miniaturized instrument electronics. The device has been designed with the following features: (1) radiation hardened by design in a commercial 0.25 μm CMOS process, (2) enclosed negative-channel metal oxide semiconductor (NMOS) transistors, guard rings and triple voted flip flops, (3)>300 krad total ionizing dose (TID) and single-event latchup (SEL)>linear energy transfer (LET) of 120 MeV/mg/cm², (4) 2.5-3.3V power supply, (5) pin selectable I²C or SPI interface, (6) 32-bit (four 8-bit ports with individual settings per bit), (7) each I/O is programmable to be input or output, (8) programmable polarity inversion for outputs, (9) programmable interrupt signal when I/O configured as input and interrupt enabled, (10) 56-lead leaded chip carrier (LDCC) flatpack packaging and other configurations contemplated.

Figure 1A:
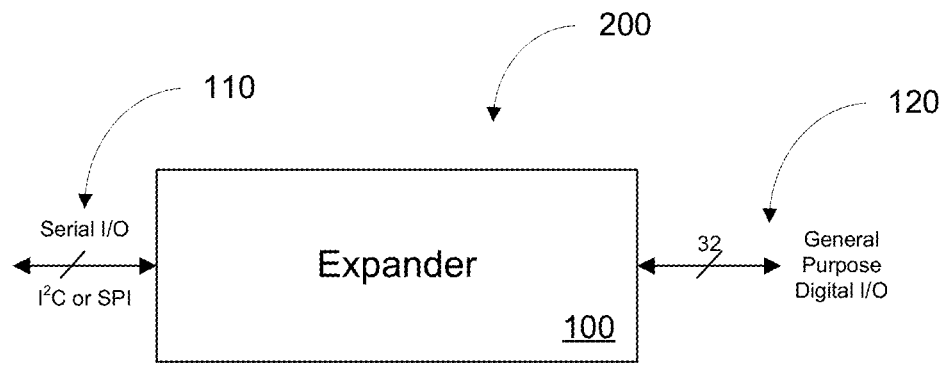
FIGS. 1A to 1C are block diagrams of various exemplary systems including an embodiment of an I/O expander with serial interfaces, according to the present invention.
Figure 1B:
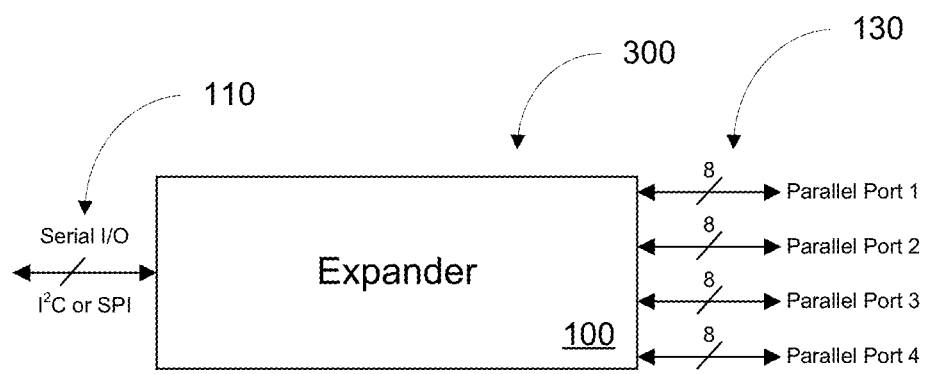
Figure 1C:
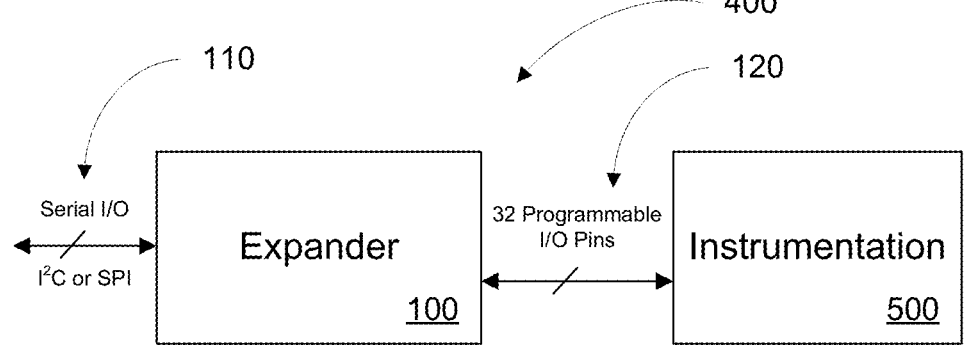

Further detailed description of the invention follows with reference to the drawings in order to provide additional disclosure of the features and operating characteristics of the novel expander. FIGS. 1A to 1C are block diagrams of various exemplary systems, shown generally at arrows 200, 300 and 400, including an embodiment of an I/O expander with serial interfaces 100, according to the present invention. More particularly, FIG. 1A illustrates a system 200 where serial I/O signals, shown generally at arrow 110, may be converted to general purpose digital I/O signals, shown generally at arrow 120. The serial I/O signals may be from an I²C or SPI bus. As shown in the embodiment of system 200 in FIG. 1A, the general purpose digital I/O signals 120 may be up to 32-bits.

The embodiment of system 300, shown in FIG. 1B, is a variant on system 200, where the general purpose digital I/O pins may be configured as 4, 8-bit digital I/O ports 130. FIG. 1C shows yet another variant of the system 200 shown in FIG. 1A. The embodiment of system 400 shown in FIG. 1C illustrates expander 100 connected to instrumentation 500. In all of the illustrated systems 200, 300 and 400, some kind of microcontroller (not shown), or central processing unit (CPU, also not shown) would act as a master controller (of the instrumentation 500, e.g., see FIG. 1C) and be interfaced serially by serial I/O 110. Moving on from these general system embodiments 200, 300 and 400, a particular embodiment of an expander 100 and how it might be used will now be explained, beginning with a theory of operation.

Table 1, below, provides operating specifications for a particular embodiment of an expander 100, according to the present invention.

TABLE 1

Expander Operating Specifications

| Parameter | Minimum | Typical | Maximum | Units |
|---|---|---|---|---|
| Supply voltage Vdd | 2.5 | 3.3 | 3.6 | V |
| Supply ground Vss | −0.1 | 0.0 | +0.1 | V |
| Operational temperature | −55 | 25 | 125 | ° C. |
| Supply current Idd (Dynamic current) | | TBD | TBD | μA |
| Input bias current | | 10 | 50 | nA |
| Input capacitance | | 10 | 12 | pF |
| Digital output sinking current | | 10 | 12 | mA |
| Output slew rate | | | | V/us |
| Switching speed SPI | | 10 | 30 | MHz |
| Switching speed I²C | | 100 | 500 | kHz |

Theory of Operation.

Figure 2:
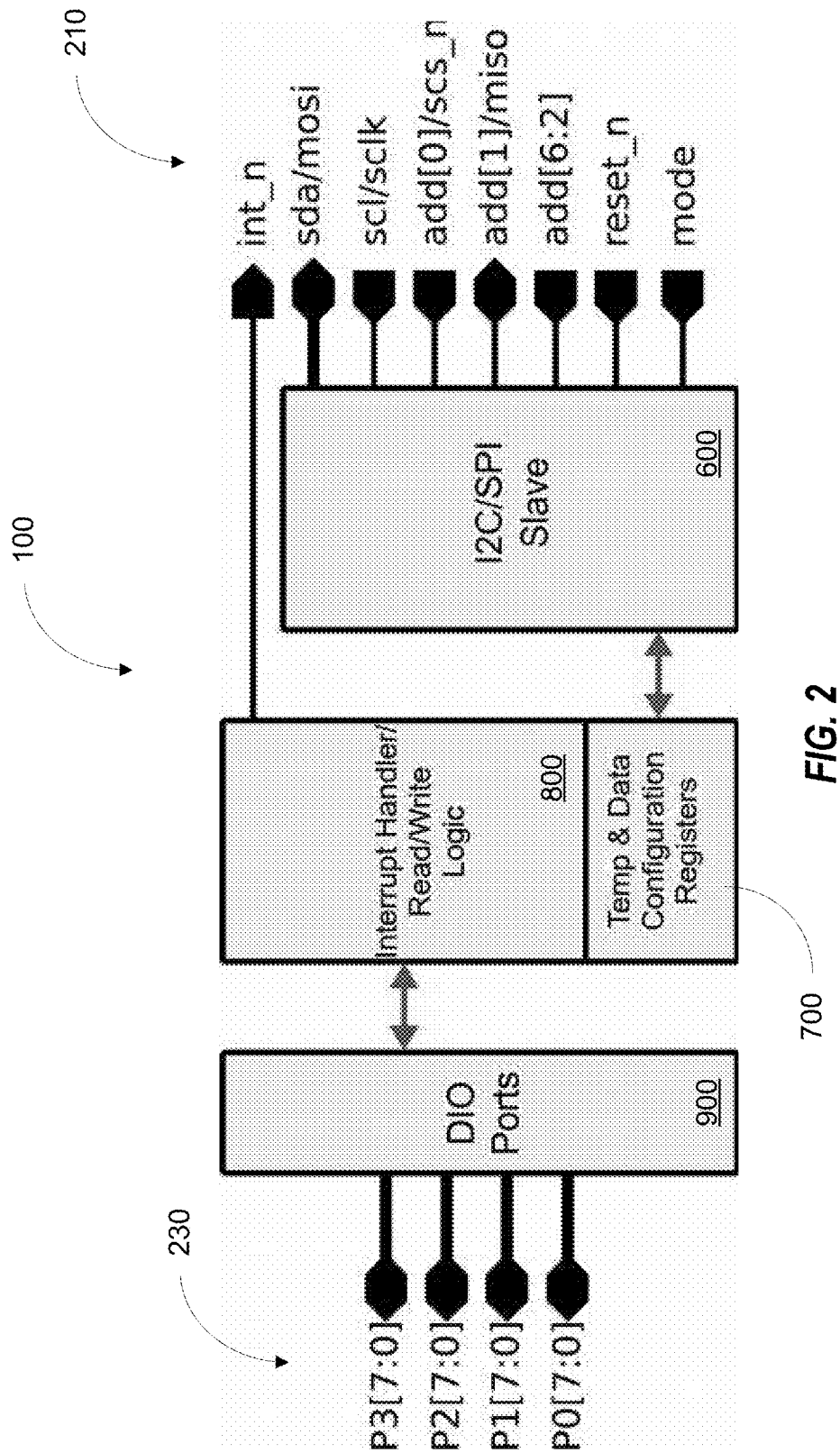
FIG. 2 is a block diagram of an embodiment of an I/O expander with serial interfaces, according to the present invention.

FIG. 2 is a block diagram of an embodiment of an I/O expander 100 with serial interfaces, according to the present invention. This embodiment of the expander 100 may be a compact and low-power ASIC that converts commands from a serial interface 210 (SPI or I²C) into a parallel bus 230 for controlling external electronics (not shown), e.g., miniaturized instrument electronics (again, not shown). As shown in FIG. 2, the expander 100 may include a SPI/I²C slave core 600, triple redundant temporary configuration and data registers 700, logic 800 to handle the read/write operations and interrupt generation, and a digital I/O ports block 900.

The expander 100 consists of four 8-bit ports 230 (P0, P1, P2 and P3) configurable as inputs or outputs. At reset, each of the individual I/Os are configured as inputs. Via I²C or SPI a system master (not shown, but connected to the serial interface 210) can:

1. Enable the digital I/Os 230 as either inputs or outputs by writing to the configuration registers (p0_cfg, p1_cfg, p2_cfg, p3_cfg) in the configuration and data registers block 700.

2. Enable the default state for input ports (p0_rddef, p1_rddef, p2_rddef, p3_rddef).

3. Enable interrupts (p0_inten, p1_inten, p2_inten, p3_inten) for individual bits of each port (when configured as inputs). A difference between the port bit value and the default state may be used to generate a one-shot interrupt, according to an embodiment of the invention. The expander 100 has a single master interrupt (active low) which combines all the interrupts. This single master interrupt requires the master to read the interrupt flag register for each expander 100 embedded device on the bus to determine which device port(s) triggered the interrupt.

4. Clear interrupts by writing to the interrupt clear address 0x7F. When an interrupt is generated it will stay active (registered) until it is cleared or the expander 100 is reset.

5. Program the temporary settings and load them by writing to the load address 0x3F. The temporary register allows storing all settings before configuring the device and allowing to load all settings simultaneously.

Mode of Operation.

Figure 5:
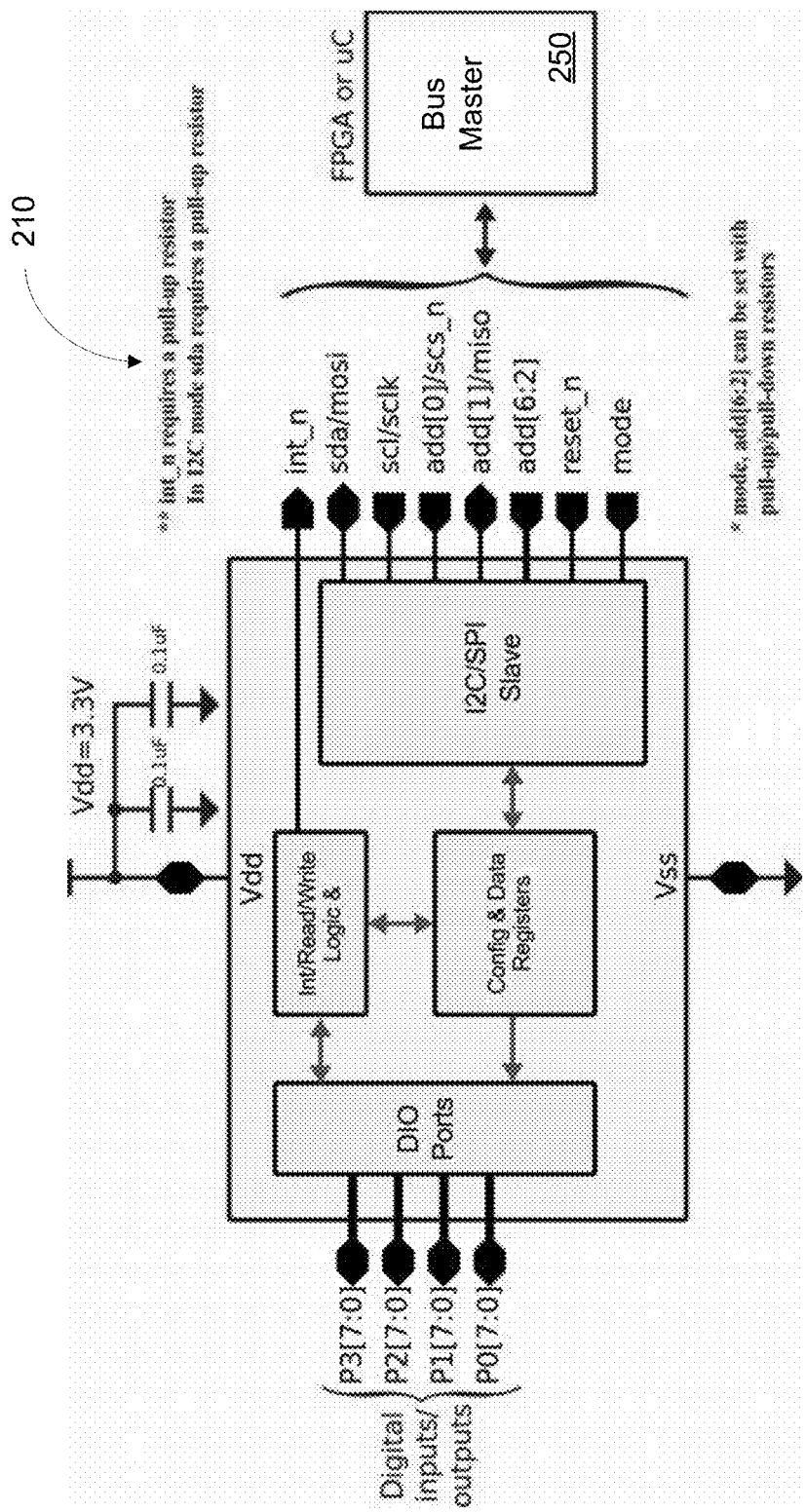
FIG. 5 is a block diagram of an exemplary implementation of an embodiment of an I/O expander with serial interfaces, according to the present invention.

FIG. 5 is a block diagram of an exemplary implementation of an embodiment of an I/O expander with serial interfaces, according to the present invention. As shown in FIG. 5, the serial interface 210 may be in communication with a bus master 250. According to one embodiment, the expander 100 may be operated using an external controller such as a FPGA or micro-controller (μC) to serve as the I²C or SPI bus master (sda/mosi, scl/sclk, add[0]/scs n, add[1]/miso, add[2:6]). For I²C operation, the mode pin can be left open or can be grounded, pins add[6:0] can be hard-wire to set the device address, and sda and scl are connected to the I²C bus. All I²C address pins, add[6:0], may have 100 kΩ pull-down resistors (not shown for clarity), according to one embodiment.

The expander 100 is also capable of being driven through an SPI interface. For SPI operation the bus master 250 (e.g., FPGA or μC) provides input serial data (moss) and clock (sclk); and reads the output serial data (miso), see FIG. 5. The FPGA or μC can optionally provide a reset_n signal and can read the interrupt signal (int). In a one embodiment, the bus master 250 may be configured to initiate all the transactions to read and write from registers. These registers are used to (1) configure the expander 100 functionality, (2) write data when ports are set as output and store data to be read by the master 250 when ports are configured as inputs. It is recommended to use bypass capacitors (e.g., two ceramic 0.1 μF capacitors) from Vdd to Vss, as shown in FIG. 5.

Figure 6:
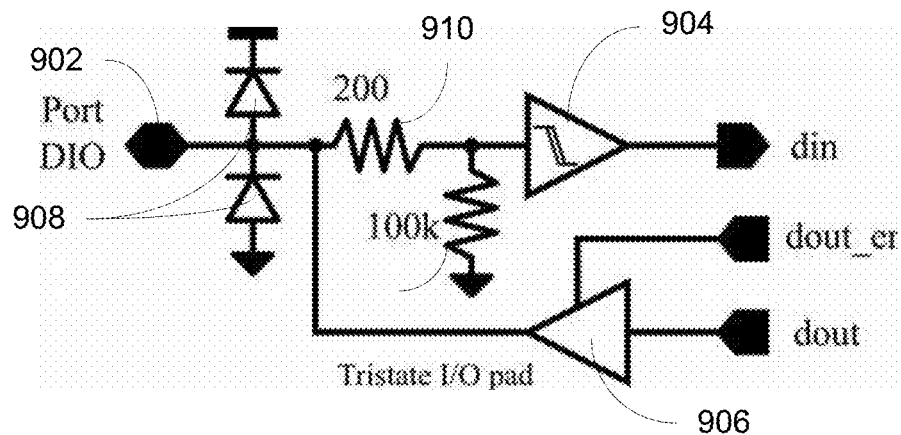
FIG. 6 is a circuit diagram illustrating an embodiment of digital bidirectional I/O pad circuitry for an embodiment of an I/O expander with serial interfaces, according to the present invention.

FIG. 6 is a circuit diagram illustrating an embodiment of digital bidirectional I/O pad circuitry for an embodiment of an I/O expander with serial interfaces, according to the present invention. Each of the digital input/output port pads 902 uses a Schmitt trigger buffer 904 for the input (din) and a tri-state buffer 906 for the output (dout, dout_en). Clamping ESD diodes 908 to Vdd and Vss and a 2000 series resistor 910 protect the input. A 100 kΩ pull-down poly resistor 912 is used which allows to have a default value of 0 for all inputs after reset. Even before setting ports (pads) 902 as outputs, this 100 kΩ pull-down poly resistor 912 will set the port 902 to Vss.

Figure 7:
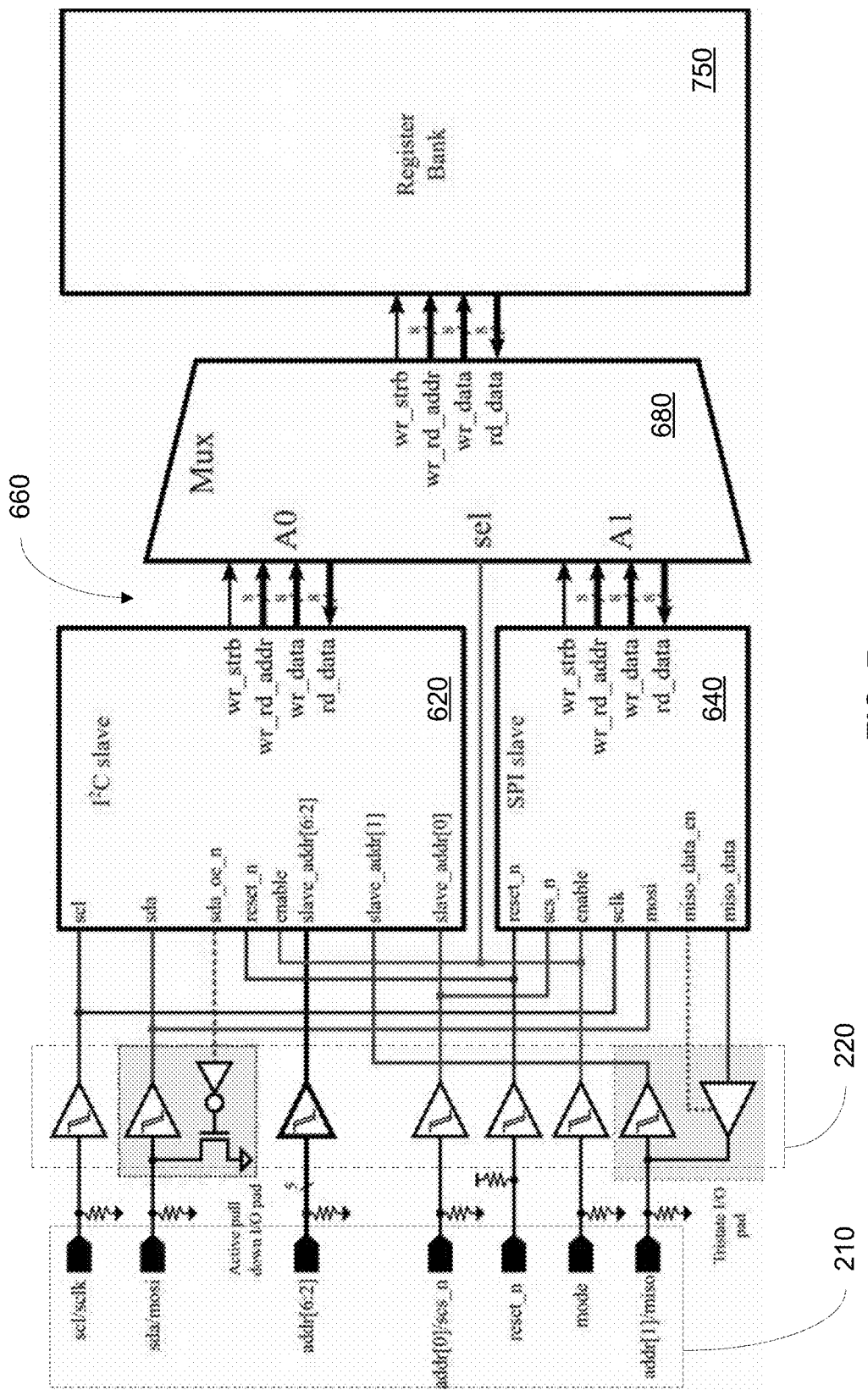
FIG. 7 is an exemplary circuit diagram illustrating the serial interface circuitry of an embodiment of an I/O expander, according to the present invention.

FIG. 7 is an exemplary circuit diagram illustrating an embodiment of the serial interface circuitry of an embodiment of an I/O expander 100, according to the present invention.

Serial Interfaces: I²C and SPI.

FIG. 7 is an exemplary circuit diagram illustrating the serial interface circuitry of an embodiment of an I/O expander, according to the present invention. More particularly, the serial interface lines, shown at dashed box 210, are buffered, shown at dashed box 220, and pass to and from the I²C slave 620 and the SPI slave 640 as shown in FIG. 7. The parallel expansion lines 660 from both the I²C slave 620 and the SPI slave 640 may then be multiplexed at mux 680 before being passed to and from register bank 750.

The expander 100 can be operated using either an I²C-compatible serial interface or SPI interface by programming the mode pin. When mode is set to logical 0, the I²C serial interface mode is selected, while a logical 1 selects the SPI interface. Thus, the particular interface is pin selectable. Both interfaces, I²C and SPI, share the inputs and outputs as shown in FIG. 7.

As further shown in FIG. 7, the I²C/SPI slave core 600 (FIG. 2) of expander 100 may include slave I2C 620 and SPI 640 cores that access register bank 750. The register bank, regbank, 750 may include 48×8-bit registers, divided in 3 sections: (1) 8×8 read-only registers, (2) 20×8 R/W temporary (treg) registers and (3) 20×8 data registers (dreg) that are read-only. The temporary register treg is used as a scratch buffer to store the chip configuration before is loaded into the data register dreg. This configuration allows configuring all the ports simultaneously. Both I²C and SPI read/write from/to treg and read from dreg using a single byte (8-bits) format. In addition, two special addresses are used to generate the load signal that copies the data treg to dreg, and to clear the interrupt flags and interrupt signal. Both serial interfaces are explained in the following sections.

I²C Mode.

The 2-wire I²C-compatible slave serial interface reads/writes from/to the register bank regbank 750 using a single byte (8-bits) format. Table 2, below, summarizes the I²C read and write transactions.

TABLE 2

Summary of I2C Transactions

| A[7:0] | Type | Register | Operation Description | Power-Up/Reset State |
|---|---|---|---|---|
| 0111 1111 | W | N/A | Clears interrupt and flag registers | N/A |
| 0011 1111 | W | N/A | Loads dreg ← treg | N/A |
| 0010 1111 | R | p3_inten | dreg Interrupt Enable Port 3 | 0000 0000 |
| 0010 1110 | R | p2_inten | dreg Interrupt Enable Port 2 | 0000 0000 |
| 0010 1101 | R | p1_inten | dreg Interrupt Enable Port 1 | 0000 0000 |
| 0010 1100 | R | p0_inten | dreg Interrupt Enable Port 0 | 0000 0000 |
| 0010 1011 | R | p3_rddef | dreg Read Default State Port 3 | 1111 1111 |
| 0010 1010 | R | p2_rddef | dreg Read Default State Por t2 | 1111 1111 |
| 0010 1001 | R | p1_rddef | dreg Read Default State Port 1 | 1111 1111 |
| 0010 1000 | R | p0_rddef | dreg Read Default State Port 0 | 1111 1111 |
| 0010 0111 | R | p3_cfg | dreg Configuration Port 3 | 0000 0000 |
| 0010 0110 | R | p2_cfg | dreg Configuration Port 2 | 0000 0000 |
| 0010 0101 | R | p1_cfg | dreg Configuration Port 1 | 0000 0000 |
| 0010 0100 | R | p0_cfg | dreg Configuration Port 0 | 0000 0000 |
| 0010 0011 | R | p3_pol | dreg Polarity Inversion Port 3 | 0000 0000 |
| 0010 0010 | R | p2_pol | dreg Polarity Inversion Port 2 | 0000 0000 |
| 0010 0001 | R | p1_pol | dreg Polarity Inversion Port 1 | 0000 0000 |

TABLE 2-continued

Summary of I2C Transactions

| A[7:0] | Type | Register | Operation Description | Power-Up/Reset State |
|---|---|---|---|---|
| 0010 0000 | R | p0_pol | dreg Polarity Inversion Port 0 | 0000 0000 |
| 0001 1111 | R | p3_wr | dreg Output Port 3 | 0000 0000 |
| 0001 1110 | R | p2_wr | dreg Output Port 2 | 0000 0000 |
| 0001 1101 | R | p1_wr | dreg Output Port 1 | 0000 0000 |
| 0001 1100 | R | p0_wr | dreg Output Port 0 | 0000 0000 |
| 0001 1011 | R/W | p3_inten_tmp | treg Interrupt Enable Port 3 | 0000 0000 |
| 0001 1010 | R/W | p2_inten_tmp | treg Interrupt Enable Port 2 | 0000 0000 |
| 0001 1001 | R/W | p1_inten_tmp | treg Interrupt Enable Port 1 | 0000 0000 |
| 0001 1000 | R/W | p0_inten_tmp | treg Interrupt Enable Port 0 | 0000 0000 |
| 0001 0111 | R/W | p3_rddef_tmp | treg Read Default State Port 3 | 1111 1111 |
| 0001 0110 | R/W | p2_rddef_tmp | treg Read Default State Port 2 | 1111 1111 |
| 0001 0101 | R/W | p1_rddef_tmp | treg Read Default State Port 1 | 1111 1111 |
| 0001 0100 | R/W | p0_rddef_tmp | treg Read Default State Port 0 | 1111 1111 |
| 0001 0011 | R/W | p3_cfg_tmp | treg Configuration Port 3 | 0000 0000 |
| 0001 0010 | R/W | p2_cfg_tmp | treg Configuration Port 2 | 0000 0000 |
| 0001 0001 | R/W | p1_cfg_tmp | treg Configuration Port 1 | 0000 0000 |
| 0001 0000 | R/W | p0_cfg_tmp | treg Configuration Port 0 | 0000 0000 |
| 0000 1111 | R/W | p3_pol_tmp | treg Polarity Inversion Port 3 | 0000 0000 |
| 0000 1110 | R/W | p2_pol_tmp | treg Polarity Inversion Port 2 | 0000 0000 |
| 0000 1101 | R/W | p1_pol_tmp | treg Polarity Inversion Port 1 | 0000 0000 |
| 0000 1100 | R/W | p0_pol_tmp | treg Polarity Inversion Port 0 | 0000 0000 |
| 0000 1011 | R/W | p3_wr_tmp | treg Output Port 3 | 0000 0000 |
| 0000 1010 | R/W | p2_wr_tmp | treg Output Port 2 | 0000 0000 |
| 0000 1001 | R/W | p1_wr_tmp | treg Output Port 1 | 0000 0000 |
| 0000 1000 | R/W | p0_wr_tmp | treg Output Port 0 | 0000 0000 |
| 0000 0111 | R | p3_intflag | treg Interrupt Flag Port 3 | 0000 0000 |
| 0000 0110 | R | p2_intflag | treg Interrupt Flag Port 2 | 0000 0000 |
| 0000 0101 | R | p1_intflag | treg Interrupt Flag Port 1 | 0000 0000 |
| 0000 0100 | R | p0_intflag | treg Interrupt Flag Port 0 | 0000 0000 |
| 0000 0011 | R | p3_rd | treg Input Port 3 | xxxx xxxx |
| 0000 0010 | R | p2_rd | treg Input Port 2 | xxxx xxxx |
| 0000 0001 | R | p1_rd | treg Input Port 1 | xxxx xxxx |
| 0000 0000 | R | p0_rd | treg Input Port 0 | xxxx xxxx |

Figure 8:
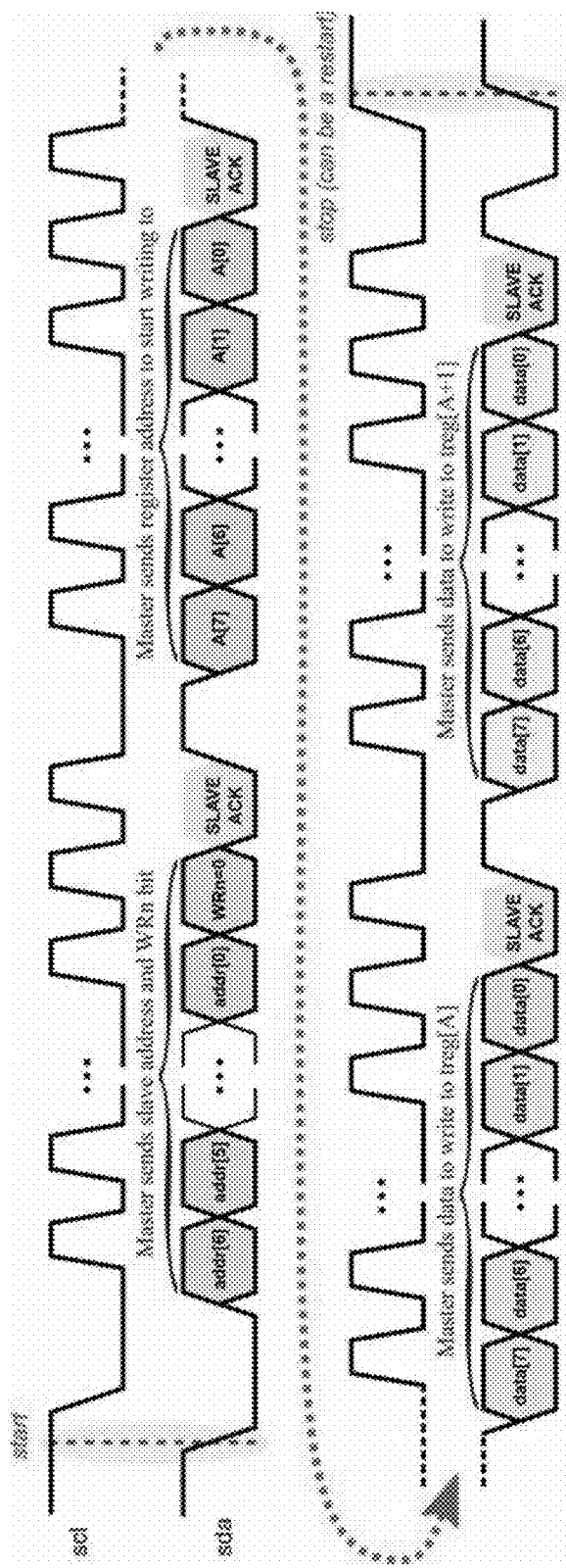
FIG. 8 is an exemplary timing diagram for an I²C serial interface write operation for an embodiment of an I/O expander with serial interfaces, according to the present invention.
Figure 9:
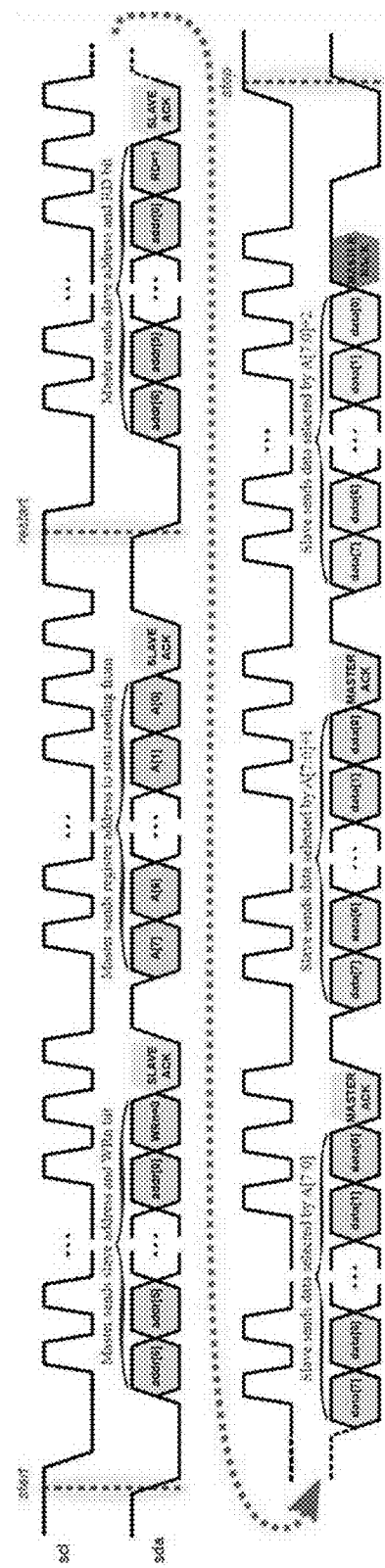
FIG. 9 is an exemplary timing diagram for an I²C serial interface read operation for an embodiment of an I/O expander with serial interfaces, according to the present invention.

FIGS. 8 and 9 show timing diagram for I2C write and read transactions, respectively. More particularly, FIG. 8 is an exemplary timing diagram for an I²C serial interface write operation for an embodiment of an I/O expander with serial interfaces, according to the present invention. Similarly, FIG. 9 is an exemplary timing diagram for an I²C serial interface read operation for an embodiment of an I/O expander with serial interfaces, according to the present invention.

Spi Mode.

The 3-wire (sclk, sdi/mosi, sdo/miso) SPI-compatible slave serial interface reads/writes from/to the registers using a single byte (8-bits) format. Table 3, below, summarizes the read and write transactions in the SPI mode.

TABLE 3

Summary of SPI Transactions

| A[6:0] | Type | Register | Operation Description | Power-Up/Reset State |
|---|---|---|---|---|
| 111 1111 | W | N/A | Clears interrupt and flag registers | N/A |
| 011 1111 | W | N/A | Loads dreg ← treg | N/A |
| 010 1111 | R | p3_inten | dreg Interrupt Enable Port 3 | 0000 0000 |
| 010 1110 | R | p2_inten | dreg Interrupt Enable Port 2 | 0000 0000 |
| 010 1101 | R | p1_inten | dreg Interrupt Enable Port 1 | 0000 0000 |
| 010 1100 | R | p0_inten | dreg Interrupt Enable Port 0 | 0000 0000 |
| 010 1011 | R | p3_rddef | dreg Read Default State Port 3 | 1111 1111 |
| 010 1010 | R | p2_rddef | dreg Read Default State Port 2 | 1111 1111 |
| 010 1001 | R | p1_rddef | dreg Read Default State Port 1 | 1111 1111 |
| 010 1000 | R | p0_rddef | dreg Read Default State Port 0 | 1111 1111 |
| 010 0111 | R | p3_cfg | dreg Configuration Port 3 | 0000 0000 |
| 010 0110 | R | p2_cfg | dreg Configuration Port 2 | 0000 0000 |
| 010 0101 | R | p1_cfg | dreg Configuration Port 1 | 0000 0000 |
| 010 0100 | R | p0_cfg | dreg Configuration Port 0 | 0000 0000 |
| 010 0011 | R | p3_pol | dreg Polarity Inversion Port 3 | 0000 0000 |
| 010 0010 | R | p2_pol | dreg Polarity Inversion Port 2 | 0000 0000 |
| 010 0001 | R | p1_pol | dreg Polarity Inversion Port 1 | 0000 0000 |
| 010 0000 | R | p0_pol | dreg Polarity Inversion Port 0 | 0000 0000 |
| 001 1111 | R | p3_wr | dreg Output Port 3 | 0000 0000 |
| 001 1110 | R | p2_wr | dreg Output Port 2 | 0000 0000 |
| 001 1101 | R | p1_wr | dreg Output Port 1 | 0000 0000 |
| 001 1100 | R | p0_wr | dreg Output Port 0 | 0000 0000 |
| 001 1011 | R/W | p3_inten_tmp | treg Interrupt Enable Port 3 | 0000 0000 |
| 001 1010 | R/W | p2_inten_tmp | treg Interrupt Enable Port 2 | 0000 0000 |
| 001 1001 | R/W | p1_inten_tmp | treg Interrupt Enable Port 1 | 0000 0000 |
| 001 1000 | R/W | p0_inten_tmp | treg Interrupt Enable Port 0 | 0000 0000 |
| 001 0111 | R/W | p3_rddef_tmp | treg Read Default State Port 3 | 1111 1111 |
| 001 0110 | R/W | p2_rddef_tmp | treg Read Default State Port 2 | 1111 1111 |
| 001 0101 | R/W | p1_rddef_tmp | treg Read Default State Port 1 | 1111 1111 |
| 001 0100 | R/W | p0_rddef_tmp | treg Read Default State Port 0 | 1111 1111 |
| 001 0011 | R/W | p3_cfg_tmp | treg Configuration Port 3 | 0000 0000 |
| 001 0010 | R/W | p2_cfg_tmp | treg Configuration Port 2 | 0000 0000 |
| 001 0001 | R/W | p1_cfg_tmp | treg Configuration Port 1 | 0000 0000 |
| 001 0000 | R/W | p0_cfg_tmp | treg Configuration Port 0 | 0000 0000 |
| 000 1111 | R/W | p3_pol_tmp | treg Polarity Inversion Port 3 | 0000 0000 |
| 000 1110 | R/W | p2_pol_tmp | treg Polarity Inversion Port 2 | 0000 0000 |
| 000 1101 | R/W | p1_pol_tmp | treg Polarity Inversion Port 1 | 0000 0000 |
| 000 1100 | R/W | p0_pol_tmp | treg Polarity Inversion Port 0 | 0000 0000 |
| 000 1011 | R/W | p3_wr_tmp | treg Output Port 3 | 0000 0000 |
| 000 1010 | R/W | p2_wr_tmp | treg Output Port 2 | 0000 0000 |
| 000 1001 | R/W | p1_wr_tmp | treg Output port 1 | 0000 0000 |
| 000 1000 | R/W | p0_wr_tmp | treg Output port 0 | 0000 0000 |
| 000 0111 | R | p3_intflag | treg Interrupt Flag Port 3 | 0000 0000 |
| 000 0110 | R | p2_intflag | treg Interrupt Flag Port 2 | 0000 0000 |
| 000 0101 | R | p1_intflag | treg Interrupt Flag Port 1 | 0000 0000 |
| 000 0100 | R | p0_intflag | treg Interrupt Flag Port 0 | 0000 0000 |
| 000 0011 | R | p3_rd | treg Input Port 3 | xxxx xxxx |
| 000 0010 | R | p2_rd | treg Input Port 2 | xxxx xxxx |
| 000 0001 | R | p1_rd | treg Input Port 1 | xxxx xxxx |
| 000 0000 | R | p0_rd | treg Input Port 0 | xxxx xxxx |

Figure 10:
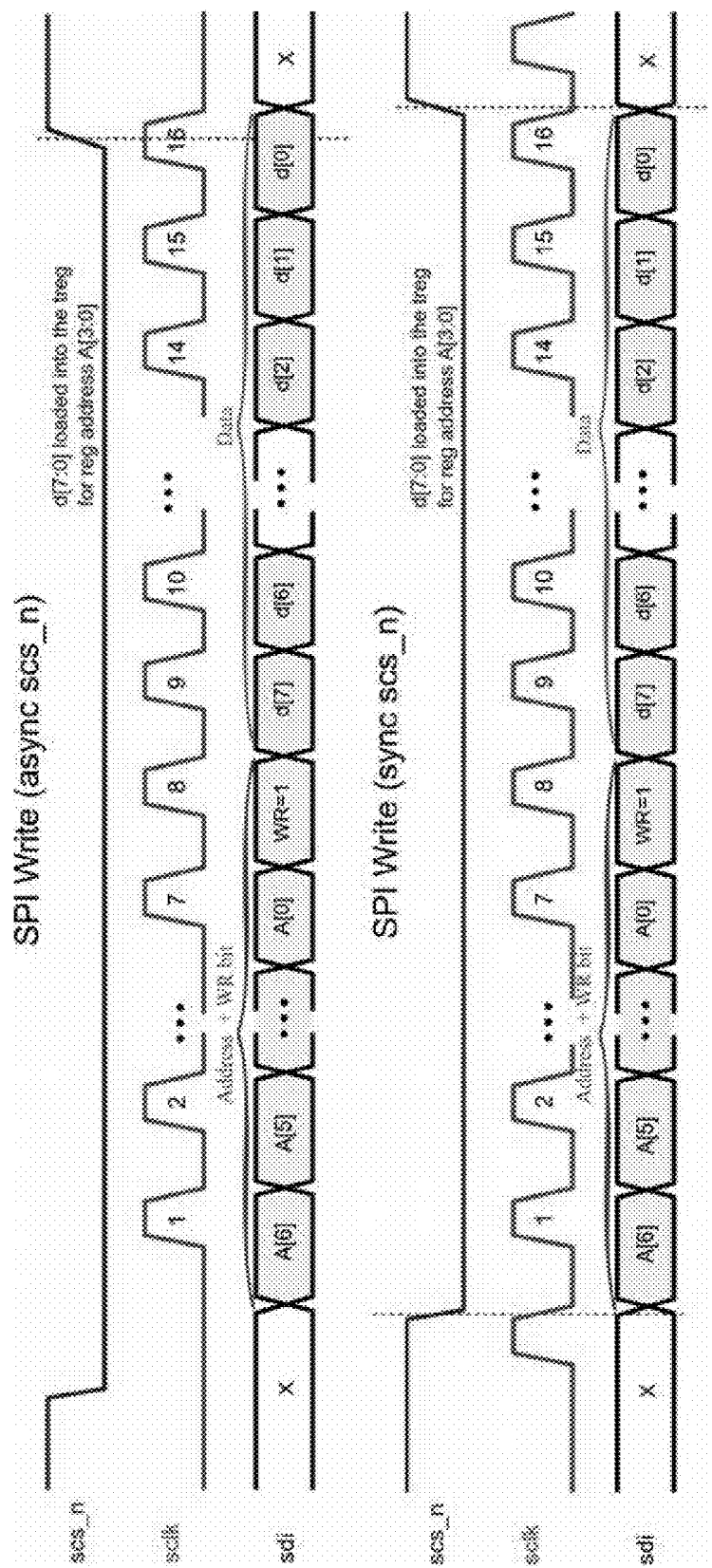
FIG. 10 is an exemplary timing diagram for an SPI serial interface write operation for an embodiment of an I/O expander with serial interfaces, according to the present invention.
Figure 11:
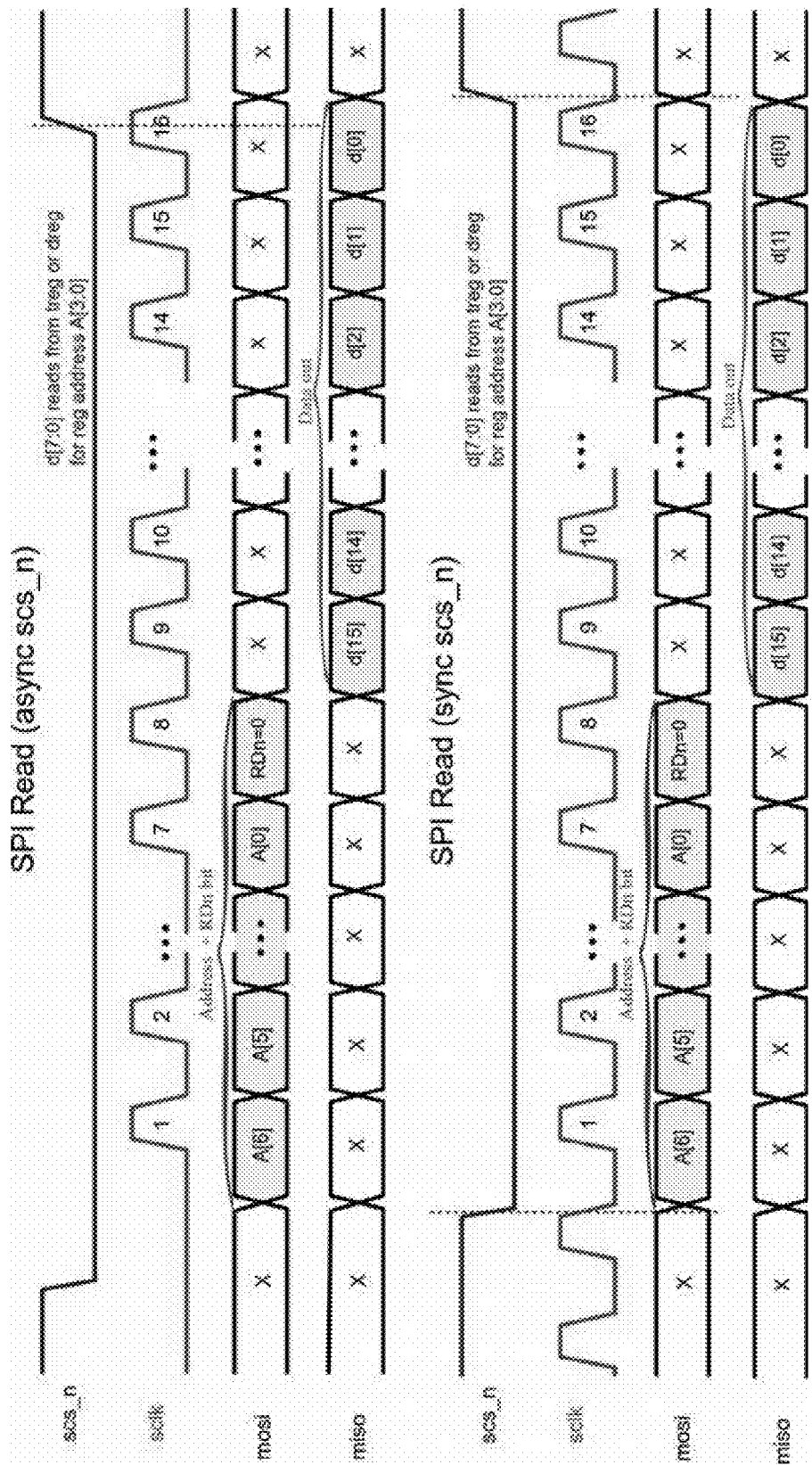
FIG. 11 is an exemplary timing diagram for an SPI serial interface read operation for an embodiment of an I/O expander with serial interfaces, according to the present invention.

FIGS. 10 and 11 show timing diagrams for write and read transactions in the SPI serial interface mode, respectively. More particularly, FIG. 10 is an exemplary timing diagram for an SPI serial interface write operation for an embodiment of an I/O expander with serial interfaces, according to the present invention. Similarly, FIG. 11 is an exemplary timing diagram for an SPI serial interface read operation for an embodiment of an I/O expander with serial interfaces, according to the present invention.

Table 4, below, provides a summary of the I/O pads (Pinout) on an embodiment of an expander 100, according to the present invention.

TABLE 4

Summary Pinout for I/O Pads

| Signal Name | Description | I/O Pad Description |
| --- | --- | --- |
| VDD | 2.5-3.3 V supply | VDD pad |
| VSS | Ground | VSS pad |
| reset_n | Active low master/global reset | Digital input (Schmitt trigger) pad with 200 Ω series resistor, ESD diodes and 100 kΩ pull up resistor. |
| mode | Selects $I^2C$ (mode = 0) or SPI (mode = 1). | Digital input (Schmitt trigger) pad with 200 Ω series resistor, ESD diodes and 100 kΩ pull down resistor. Can be left floating or tie to VSS for $I^2C$ mode; tie to VDD for SPI mode. |
| scl/sclk | $I^2C$/SPI clock | Digital input (Schmitt trigger) pad with 200 Ω series resistor, ESD diodes and 100 kΩ pull down resistor. |
| sda/mosi | $I^2C$ data/SPI serial data in | Digital bidir pad (Schmitt trigger) input with 200 Ω series resistor, ESD diodes and active (NMOS) pull down output. External pull-up required. |
| addr[0]/scs_n | $I^2C$ address bit 0/SPI active low chip select | Digital input (Schmitt trigger) pad with 200 Ω series resistor, ESD diodes and 100 kΩ pull down. |
| addr[1]/miso | $I^2C$ address bit 1/SPI serial data out | Digital bidir (Schmitt trigger input) pad with 200 Ω series resistor, ESD diodes and 100 kΩ pull down and 10 mA tri-state output buffer. |
| addr[6:2] | $I^2C$ address bits 2 to 6. | Digital input (Schmitt trigger) pad with 200 Ω series resistor, ESD diodes and 100 kΩ pull down. |
| p3[7:0] | Expander Digital I/O Port 3 | Digital bidir (Schmitt trigger input) pad with 200 Ω series resistor, ESD diodes, and 100 kΩ pull-down and 10 mA output buffer. |
| p2[7:0] | Expander Digital I/O Port 2 | Digital bidir (Schmitt trigger input) pad with 200 Ω series resistor, ESD diodes, and 100 kΩ pull-down and 10 mA output buffer. |
| p1[7:0] | Expander Digital I/O Port 1 | Digital bidir (Schmitt trigger input) pad with 200 ohms series resistor, ESD diodes, and 100 kΩ pull-down and 10 mA output buffer. |
| p0[7:0] | Expander Digital I/O Port 0 | Digital bidir (Schmitt trigger input) pad with 200 Ω series resistor, ESD diodes, and 100 kΩ pull-down and 10 mA output buffer. |
| int_n | Active low interrupt | Digital output pad, ESD diodes and active (NMOS) pull down output. External pull-up required. |

Figure 12:
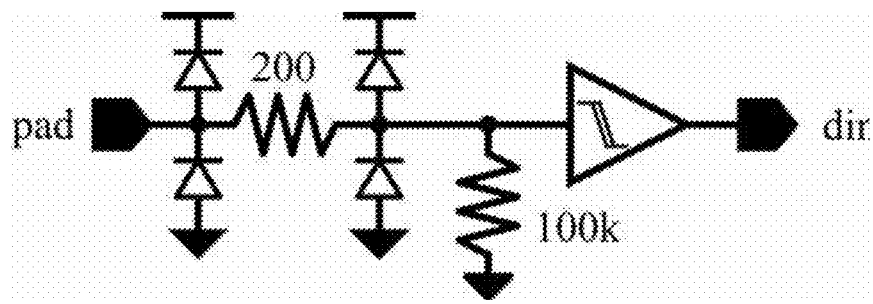
FIG. 12 is a circuit diagram illustrating an embodiment of digital input pad circuitry for an embodiment of an I/O expander with serial interfaces, according to the present invention.

FIG. 12 is a circuit diagram illustrating an embodiment of digital input pad circuitry for an embodiment of an I/O expander 100 with serial interfaces, according to the present invention.

Figure 13:
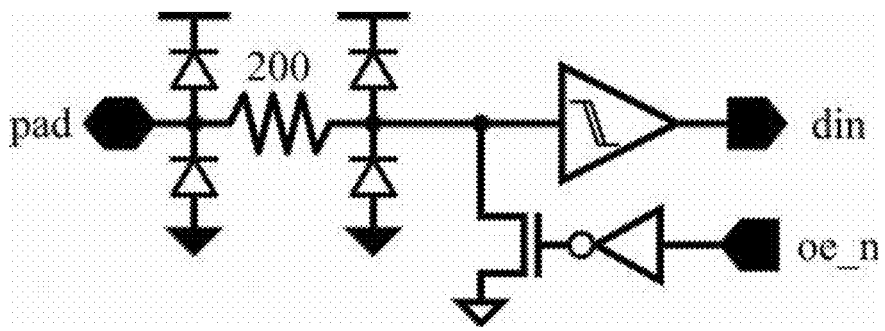
FIG. 13 is a circuit diagram illustrating an embodiment of digital bidirectional I/O pad circuitry with active pull down for I²C implementation for an embodiment of an I/O expander with serial interfaces, according to the present invention.

FIG. 13 is a circuit diagram illustrating an embodiment of digital bidirectional I/O pad circuitry with active pull down for $I^2C$ implementation for an embodiment of an I/O expander 100 with serial interfaces, according to the present invention.

Dies and Packaging.

Figure 3:
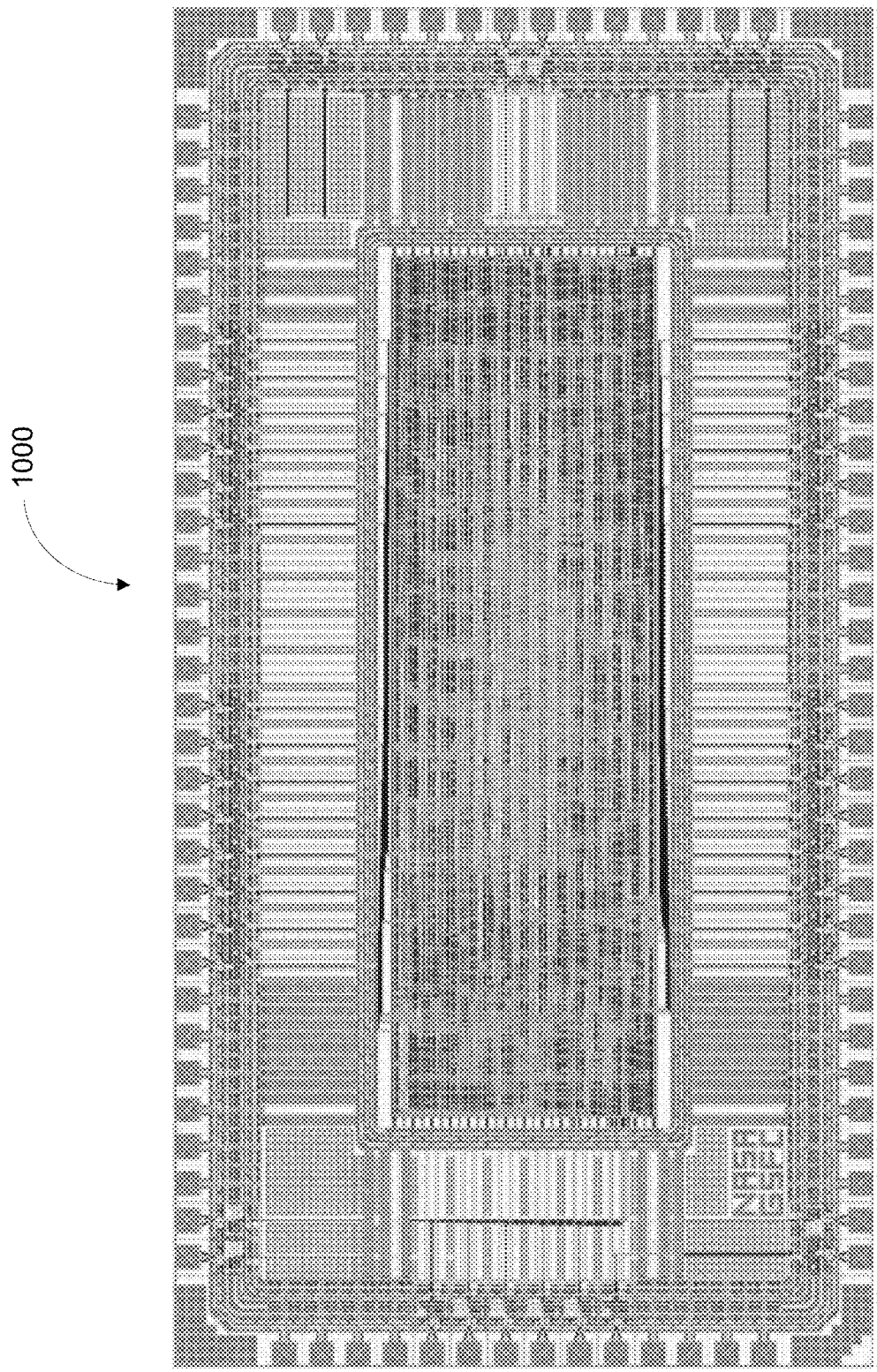
FIG. 3 is a silicon die embodiment of an I/O expander with serial interfaces, according to the present invention.

FIG. 3 is a silicon die 1000 embodiment of an I/O expander with serial interfaces, according to the present invention. Die 1000 illustrates an exemplary silicon layout used to manufacture the expander 100 using conventional CMOS processes.

Figure 4:
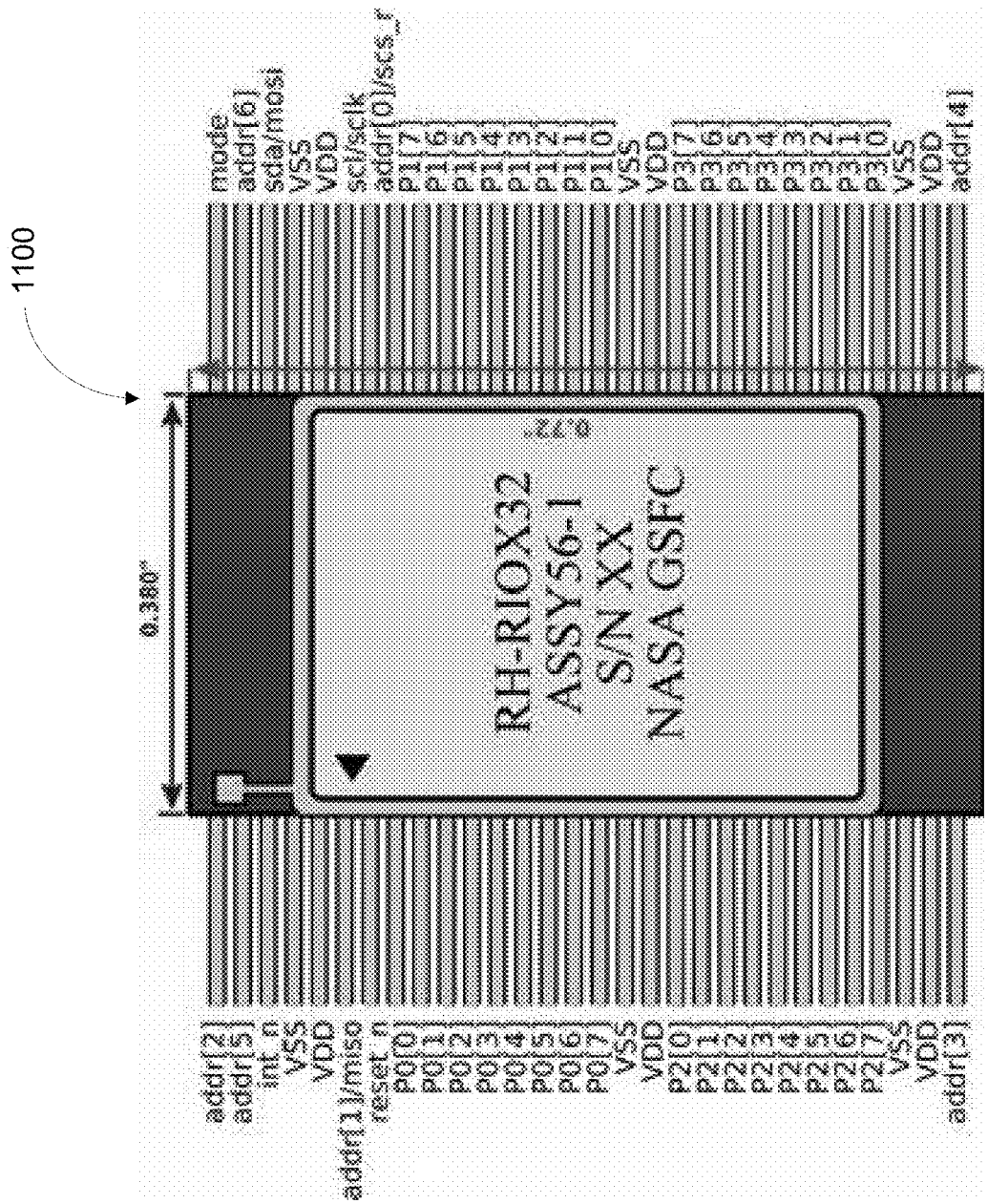
FIG. 4 is a pin-out diagram of an embodiment of an I/O expander with serial interfaces implemented in a 56-lead ceramic flatpack package, according to the present invention.

FIG. 4 is a pin-out diagram of an embodiment of an I/O expander 100 with serial interfaces as implemented in a 56-lead ceramic flatpack package 1100, according to the present invention. However, other packages and embodiments of the expander 100 are contemplated and within the scope of the present invention, see for example FIGS. 14 and 15 and discussion below.

Figure 14:
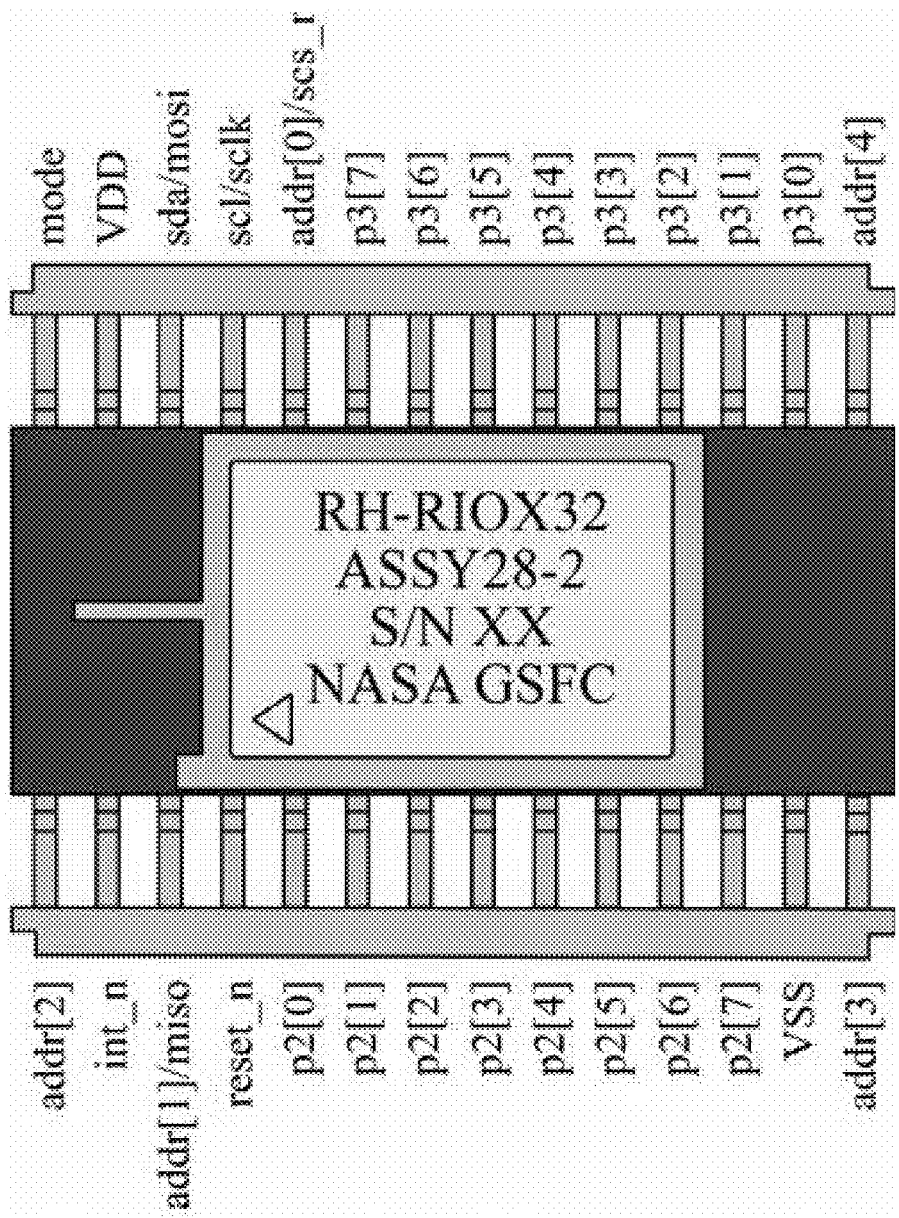
FIG. 14 is a pin-out diagram of an embodiment of an I/O expander with serial interfaces implemented in a 28-lead ceramic SOIC package with reduced I²C address bits, according to the present invention.
Figure 15:
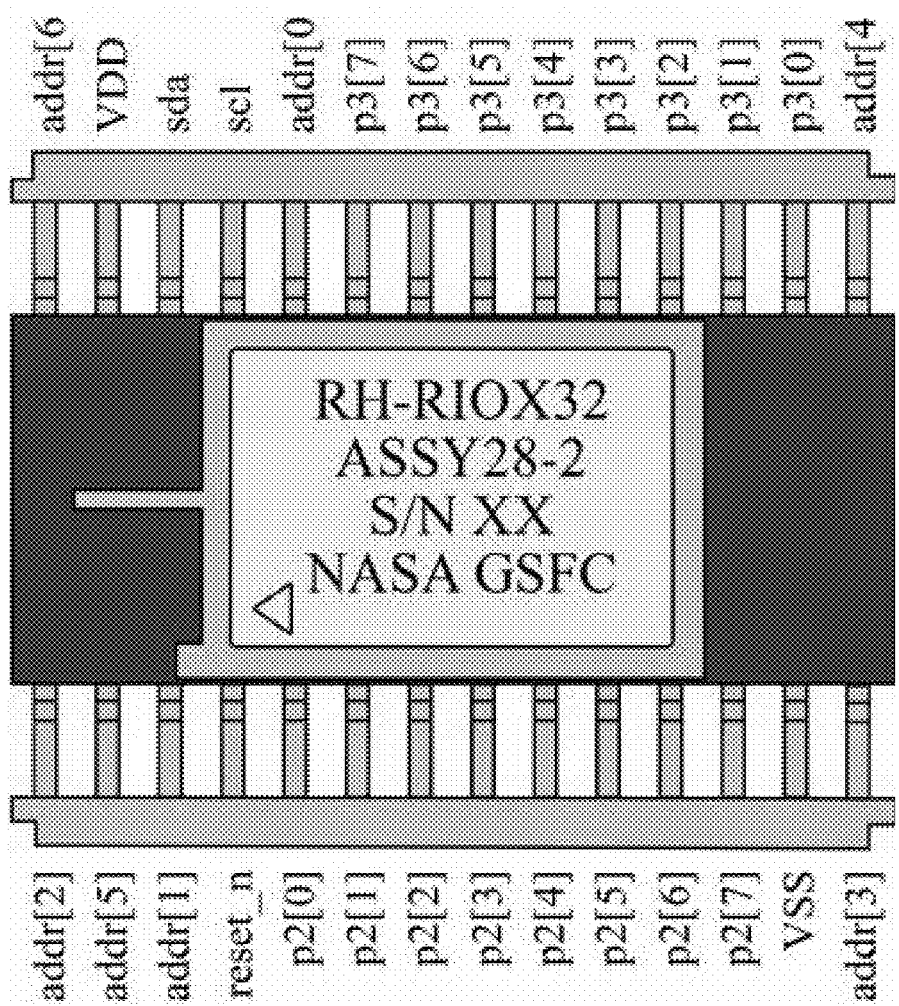
FIG. 15 is a pin-out diagram of an embodiment of an I/O expander with serial interfaces implemented in a 28-lead ceramic SOIC package I²C serial interface only, with no interrupt, according to the present invention.

FIG. 14 is a pin-out diagram of an embodiment of an I/O expander with serial interfaces implemented in a 28-lead ceramic SOIC package with reduced $I^2C$ address bits, according to the present invention. FIG. 15 is a pin-out diagram of an embodiment of an I/O expander with serial interfaces implemented in a 28-lead ceramic SOIC package $I^2C$ serial interface only, with no interrupt, according to the present invention. The alternative packages illustrated in FIGS. 14 and 15 are alternative embodiments of an expander that may be obtained with using a subset of the full capability of the expander 100 disclosed herein.

Having described the embodiments of expander 100 shown in the drawings and their particular structural features and variations using particular terminology, additional more general embodiments of the expander 100 will now be disclosed. The following embodiments may or may not correspond precisely to the illustrated embodiments, but will have structure and features that are readily apparent based on the description of the drawings as provided herein.

An input/output (I/O) expander is disclosed. The I/O expander may include a serial interface for communicating with an external controller. The I/O expander may further include a configuration and data registers block in communication with the serial interface. The I/O expander may further include a logic block in communication with the external controller and the configuration and data registers block. The I/O expander may further include a plurality of digital I/O ports in communication with the logic block and the configuration and data registers block, each of the plurality of digital I/O ports configured to send or receive static signals under control by the external controller through the serial interface.

According to another embodiment of the expander, the serial interface may include at least one of the following serial interfaces: $I^2C$ and SPI. According to yet another embodiment of the expander, configuration registers in the configuration and data registers block may be used to configure the expander. According to still another embodiment of the expander, data registers in the configuration and data registers block may be used to temporarily store data written to, and read from, the plurality of digital I/O ports.

According to another embodiment of the expander, the logic block may include circuitry for generating interrupt signals sent to the external controller. According to yet another embodiment of the expander, the logic block may include circuitry for generating read/write signals sent to and from the plurality of digital I/O ports. According to still another embodiment of the expander, each of the plurality of digital I/O ports may include a Schmitt trigger buffer for input signals and a tri-state buffer for output signals.

According to another embodiment of the expander, each of the plurality of digital I/O ports may further include a first electrostatic discharge (ESD) clamping diode is tied between an input signal from the digital I/O port and a power source. According to this particular embodiment, each of the plurality of digital I/O ports may further include a second ESD clamping diode is tied between the input signal and ground. According to this particular embodiment, each of the plurality of digital I/O ports may further include a series resistor is connected between the input signal and input to the Schmitt trigger buffer. According to another embodiment of the expander, each of the plurality of digital I/O ports may further include a pull-down resistor between the input to the Schmitt trigger buffer and ground.

According to one embodiment of the expander, each of the plurality of digital I/O ports may further include 4 digital I/O ports. According to yet another embodiment of the expander, the 4 digital I/O ports may each include 8-bits, wherein each bit is individually configurable. According to another embodiment of the expander, the plurality of digital I/O ports may include 32-bits. According to yet another embodiment of the expander, each of the 32-bits may be individually programmable to be an input signal or an output signal.

According to another embodiment, the expander may further include programmable polarity inversion for the digital output signals. According to yet another embodiment, the expander may further include radiation hardening for use in space. According to one embodiment the level of radiation hardening of the expander is capable of withstanding greater than 300 krad total ionizing dose (TID) and single-event latchup (SEL)>linear energy transfer (LET) of 120 MeV/mg/cm².

According to still yet another embodiment of the expander, the serial interface may be pin selectable between inter-integrated circuit (I²C) serial interface, or a serial peripheral interface (SPI). According to one embodiment, the expander may be packaged in a 56-lead leaded chip carrier (LDCC) flatpack.

The embodiments of expander disclosed herein and its components may be formed of any suitable semiconductor materials using processes known to those of ordinary skill in the art.

In understanding the scope of the present invention, the term "configured" as used herein to describe a component, section or part of a device may include any suitable mechanical hardware that is constructed or enabled to carry out the desired function. In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part", "section", "portion", "member", or "element" when used in the singular can have the dual meaning of a single part or a plurality of parts. As used herein to describe the present invention, the following directional terms "forward, rearward, above, downward, vertical, horizontal, below and transverse" as well as any other similar directional terms refer to those directions relative to the front of an embodiment of a nozzle that has an orifice as described herein. Finally, terms of degree such as "substantially", "about" and "approximately" as used herein mean a reasonable amount of deviation of the modified term such that the end result is not significantly changed.

While the foregoing features of the present invention are manifested in the detailed description and illustrated embodiments of the invention, a variety of changes can be made to the configuration, design and construction of the invention to achieve those advantages. Hence, reference herein to specific details of the structure and function of the present invention is by way of example only and not by way of limitation.

What is claimed is:

1. An input/output (I/O) expander, comprising:
   a serial interface for communicating with an external controller;
   a configuration and data registers block in communication with the serial interface;
   a logic block in communication with the external controller and the configuration and data registers block; and
   a plurality of digital I/O ports in communication with the logic block and the configuration and data registers block, each of the plurality of digital I/O ports configured to send or receive static signals under control by the external controller through the serial interface;
   wherein the input/output I/O expander includes a radiation hardened 32-bit remote I/O port;
   a compact and low-power application specific integrated circuit that converts commands from a serial interface into a parallel bus for miniaturized instrument electronics containing a radiation hardened by a commercial 0.25 μm CMOS process;
   a plurality of enclosed negative-channel metal oxide semiconductor (NMOS) transistors, guard rings and triple voted flip flops;
   a greater 300 krad total ionizing dose and single-event latchup linear energy transfer of 120 MeV/mg/cm²;
   a 2.5-3.3V power supply;
   a pin selectable interface;
   said digital I/O ports where each I/O port is programmable to be one of input and output capable of programmable polarity inversion for outputs;
   programmable interrupt signal when I/O configured as input and interrupt enabled in a leaded chip carrier flatpack package.

2. The expander according to claim 1, wherein the serial interface comprises at least one of the following serial interfaces: inter-integrated circuit (I2C) and a serial peripheral interface (SPI).

3. The expander according to claim 1, wherein configuration registers in the configuration and data registers block are used to configure the expander.

4. The expander according to claim 1, wherein data registers in the configuration and data registers block are used to temporarily store data written to, and read from, the plurality of digital I/O ports.

5. The expander according to claim 1, wherein the logic block comprises circuitry for generating interrupt signals sent to the external controller.

6. The expander according to claim 1, wherein the logic block comprises circuitry for generating read/write signals sent to and from the plurality of digital I/O ports.

7. The expander according to claim 1, wherein each of the plurality of digital I/O ports comprises Schmitt trigger buffer for input signals and a tri-state buffer for output signals.

8. The expander according to claim 7, wherein each of the plurality of digital I/O ports further comprises:
   a first electrostatic discharge (ESD) clamping diode is tied between an input signal from the digital I/O port and a power source;
   a second ESD clamping diode is tied between the input signal and ground; and
   a series resistor is connected between the input signal and input to the Schmitt trigger buffer.

9. The expander according to claim 8, wherein each of the plurality of digital I/O ports further comprises a pull-down resistor between the input to the Schmitt trigger buffer and ground.

10. The expander according to claim 1, wherein each of the plurality of digital I/O ports further comprises 4 digital I/O ports.

11. The expander according to claim 10, wherein the 4 digital I/O ports each comprise 8-bits and wherein each bit is individually configurable.

12. The expander according to claim 1, wherein the plurality of digital I/O ports comprises 32-bits.

13. The expander according to claim 12, wherein each of the 32-bits is programmable to be an input signal or an output signal.

14. The expander according to claim 13, further comprising programmable polarity inversion for output signals.

15. The expander according to claim 1, further comprising radiation hardening for use in space.

16. The expander according to claim 1, wherein the serial interface is pin selectable between inter-integrated circuit ($I^2C$) serial interface, or a serial peripheral interface (SPI).

17. The expander according to claim 1, further comprising 56-lead leaded chip carrier (LDCC) flatpack packaging.

* * * * *